(12) United States Patent
Zhang et al.

(10) Patent No.: US 8,384,181 B2
(45) Date of Patent: Feb. 26, 2013

(54) SCHOTTKY DIODE STRUCTURE WITH SILICON MESA AND JUNCTION BARRIER SCHOTTKY WELLS

(75) Inventors: Qingchun Zhang, Cary, NC (US); Sei-Hyung Ryu, Farmington Hills, MI (US)

(73) Assignee: Cree, Inc., Durham, NC (US)

( * ) Notice: Subject to any disclaimer, the term of this patent is extended or adjusted under 35 U.S.C. 154(b) by 1000 days.

(21) Appl. No.: 11/673,117

(22) Filed: Feb. 9, 2007

(65) Prior Publication Data

US 2008/0191304 A1 Aug. 14, 2008

(51) Int. Cl.
*H01L 29/47* (2006.01)
(52) U.S. Cl. .................. 257/471; 257/E27.068; 438/570
(58) Field of Classification Search ........... 257/E31.065, 257/E31.066, E29.338, E27.04, E27.068, 257/E29.041, 471; 438/570
See application file for complete search history.

(56) References Cited

U.S. PATENT DOCUMENTS

| | | | |
|---|---|---|---|
| 6,104,043 A | 8/2000 | Hermansson et al. | |
| 6,407,413 B1 * | 6/2002 | Kawamoto | 257/133 |
| 6,524,900 B2 | 2/2003 | Dahlqvist et al. | |
| 7,005,347 B1 | 2/2006 | Bhalla et al. | |
| 7,026,668 B2 | 4/2006 | Hatakeyama et al. | |
| 2002/0175342 A1 * | 11/2002 | Tsui et al. | 257/155 |
| 2004/0212011 A1 * | 10/2004 | Ryu | 257/335 |
| 2005/0230744 A1 * | 10/2005 | Wu | 257/330 |
| 2006/0237813 A1 | 10/2006 | Hshieh et al. | |
| 2007/0228505 A1 * | 10/2007 | Mazzola et al. | 257/471 |

FOREIGN PATENT DOCUMENTS

EP 0372428 6/1990

OTHER PUBLICATIONS

Henning, et al., "Electrical characteristics of rectifying polycrystalline silicon/silicon carbide heterojunctions," Journal of Electronic Materials, Apr. 1998, 3 pages.
Tanaka et al., "Ultra-low Von and High Voltage 4H-SiC Heterojunction Diodes," International Symposium of Power Semiconductor Devices and Integrated Circuits, Proc. of 17th ISPSD, May 25-26, 2005, pp. 287-290.
Buchanan, Jr. et al.; U.S. Statutory Invention Registration; Reg. No. H40; Published Apr. 1, 1986; pp. 9.

* cited by examiner

*Primary Examiner* — Kimberly Rizkallah
*Assistant Examiner* — Timor Karimy
(74) *Attorney, Agent, or Firm* — Withrow & Terranova, P.L.L.C.

(57) ABSTRACT

A power diode having a silicon mesa atop the drift region includes a first contact positioned on the silicon mesa. The silicon mesa is highly doped p-type or n-type, and the anode may be formed on the mesa. The mesa may include two separate silicon layers, one of which is a Schottky barrier height layer. Under a forward bias, the silicon mesa provides carriers to achieve desirable forward current characteristics. The substrate has a significantly reduced thickness. The diode achieves reverse voltage blocking capability by implanting junction barrier Schottky wells within the body of the diode. The diode utilizes a deeper portion of the drift region to support the reverse bias. The method of forming the diode with a silicon mesa includes forming the mesa within a window on the diode or by thermally or mechanically bonding the silicon layer to the drift region.

41 Claims, 6 Drawing Sheets

SCHOTTKY DIODE STRUCTURE WITH SILICON MESA AND JUNCTION BARRIER SCHOTTKY WELLS

BACKGROUND

The present invention relates to the high voltage blocking characteristics of power diodes that also conduct large currents under forward bias. Power diodes are used in multiple applications that require rapid switching between a voltage blocking state that allows no current to pass and an on-state that quickly allows large currents to flow in one direction. The problem addressed in this invention is that of achieving a device that operates optimally in both states.

Current technology includes power Schottky diodes that have doped Junction Barrier Schottky (JBS) structures to improve the blocking characteristics of the diode. Statutory invention registration No. H40 (Buchanan 1986) discloses a silicon power diode that includes field shields within the Schottky barrier of the device. The field shields are highly doped p-type diffusions in the n– type silicon drift layer directly adjacent the metal-silicon heterojunction. Buchanan, however, is only concerned with increasing the reverse blocking voltage that the Schottky diode can withstand. These p-type diffusion regions have the possibility of increasing the forward voltage drop in the on state. Buchanan offers no disclosure in regard to maintaining forward conductivity in the presence of voltage blocking enhancements.

U.S. Patent Application Publication No. 2006/0237813 (Hashieh) explains the limitations of the Buchanan disclosure and sets forth an attempt at addressing the forward biased performance problems inherent in a Schottky diode with JBS implants in the drift region. Hashieh forms an array of PN junctions as adjacent diffusion regions to reduce forward barrier heights while increasing reverse blocking voltages. Hashieh's array is located within the drift region of the device and includes highly doped $p^+$ and $n^+$ implants directly adjacent a top silicide layer to which a metal contact is applied. The $n^+$ implants function as forward barrier reduction regions while the $p^+$ implants function as the opposite—blocking voltage increasing regions. The silicide layer in the Hashieh device increases forward conductivity as well.

Other publications also the show a JBS structure in the drift region of Schottky power diode. U.S. Pat. No. 6,104,043 (Hermansson et al., 2000) discloses a Schottky diode in which the JBS implants are positioned within a silicon carbide drift layer. U.S. Pat. No. 6,524,900 (Dahlqvist, 2003) improves the method of controlling the temperature dependence of a junction barrier Schottky diode, particularly in materials having conduction bands exceeding 2 eV.

Forming Schottky barrier diodes with silicon layers has been known for years. Adding JBS technology to a silicon diode has already been shown, for example, in European Patent Application No. EP 0372428 (Sugita 1990). Prior research in power diodes, including a previously published article from the Journal of Electronic Materials (Henning 1998), also discloses the properties of forming a heterojunction between a silicon mesa and a semiconductor drift region of silicon carbide. The prior work that incorporates JBS structures in silicon layers fails to solve the problem, however, that increasing on-state performance decreases the maximum voltage blocking capability of the device.

Another combination of JBS technology with silicon contact layers was disclosed at the International Symposium on Power Semiconductor Devices and Integrated Circuits (Tanaka et al. 2005). Tanaka discloses an example of a prior art diode using both a silicon layer adjacent the anode and a JBS structure in the drift layer to form termination regions at the edges of the device. The JBS implanted structures protect the Tanaka diode from high electric fields along its edges and cross currents in that region. Tanaka fails to realize, however, the possibility of using JBS technology to improve the reverse biased characteristics of the diode by incorporating the JBS implants within the conductive channel of the drift region. Tanaka also uses a standard silicon carbide substrate that is bound to increase the on resistance of the device.

Accordingly a need still exists for an improved power Schottky diode having desirable operating parameters in both the on-state and under a reverse bias.

BRIEF SUMMARY OF THE INVENTION

In one aspect, the invention is a diode having a silicon mesa atop the drift region. A contact is positioned on the silicon mesa. In a preferred embodiment, the diode has an n– type drift region on which the silicon mesa is formed. The silicon mesa is therefore highly doped p-type (or n-type, depending on the application), and the anode (or cathode) is formed on the mesa. The diode of this invention achieves a high forward conductivity in the on-state and exhibits a significantly higher reverse voltage blocking ability than diodes of the prior art. Under a forward bias, the silicon mesa provides carriers to achieve desirable forward current characteristics. The mesa may be formed of polysilicon. For high reverse voltages (e.g., $\geq 600$ V), p-type polysilicon is desirable. For diodes used in applications with less than 600 V reversed biases, n-type polysilicon is better.

The diode disclosed herein has superb performance characteristics, even when the substrate is of a significantly reduced thickness. The diode achieves a considerable reverse blocking voltage by implanting junction barrier Schottky wells within the body of the diode, i.e., between the edge of the diode and its absolute center. This allows the diode to support the reverse bias more deeply into the thickness of the drift region.

In another aspect, the invention is a method of forming a diode by growing a silicon carbide drift region having an n– doping type on a silicon carbide substrate and forming at least one junction barrier Schottky well within the conductive channel of the drift region. The method includes forming a silicon mesa on the drift region adjacent the junction barrier Schottky well. The step of forming the silicon mesa includes forming the mesa within a window on the diode or by thermally or mechanically bonding the silicon layer to the drift region. The mesa may include a separate layer of silicon on the drift region functioning as a Schottky barrier height layer.

DETAILED DESCRIPTION

The diode of this invention achieves a low on-resistance and yields surging capability as well as avalanche breakdown by incorporating a doped silicon mesa and JBS implants into the body of the device. The new construction also allows the substrate to be extremely thin. By adjusting the thickness of the silicon mesa, the diode disclosed herein also maintains sufficient mechanical strength for dicing and incorporating into a larger circuit.

Figure 1:
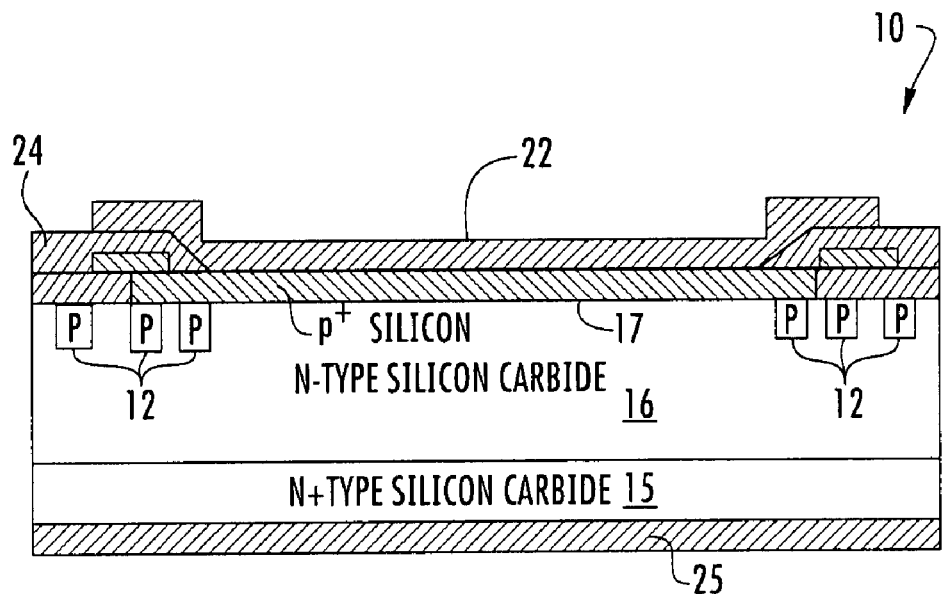
FIG. 1 is a prior art diode having JBS implants in the termination region of the drift layer.

FIG. 1 shows a prior art heterojunction diode (10) having JBS implants (12) along the edges of the junction region for terminating the device. The diode (10) includes $n^+$ type (15) and $n^-$ type (16) silicon carbide layers supporting a p+ type silicon layer (17). The anode (22) is connected to the p+ silicon layer (17), and the edges of the silicon layer (22), the n− layer (16), and the anode (22) are covered with a nonconductive passivation layer (24). The prior art diode (10) is completed with a cathode (25).

Figure 2:
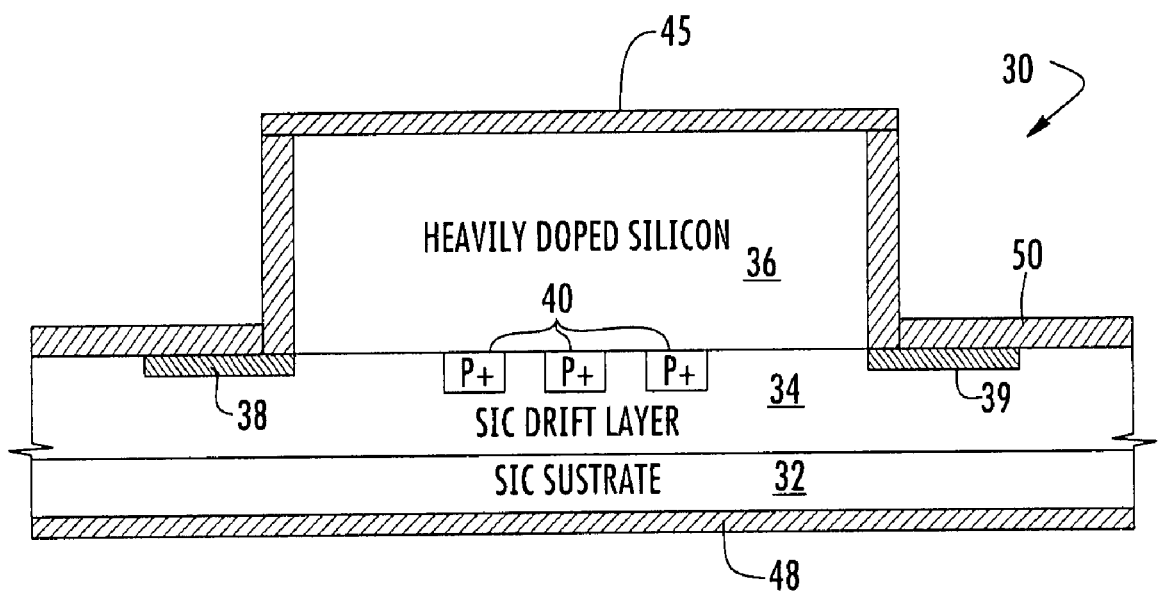
FIG. 2 is a diode according to this invention having JBS implants in the conductive channel of the diode and a silicon mesa contact.

FIG. 2 shows an improved heterojunction diode (30) according to this invention. The diode can be formed of numerous semiconductor materials, with silicon and silicon carbide being the most preferred. The diode (30) of FIG. 2 includes an $n^+$ silicon carbide substrate (32), an $n^-$ drift layer of silicon carbide (34), and a heavily doped $p^+$ type silicon layer (36) in the form of a semiconductor mesa on the drift layer (34). Opposite polarities are possible, depending upon the application.

A Schottky barrier can be formed by a separate silicon layer (42), which is deposited on top of the silicon carbide drift layer (34). The barrier height can be adjusted by carefully choosing the type and concentration of dopants in the silicon.

The $n^-$ drift layer (34) includes p-type doped wells (40) at appropriate locations to accomplish the goals of this new construction. First, the diode (30) has termination regions (38, 39) along the edges of the intersection between the silicon and silicon carbide layers (34, 36). The termination regions (38, 39) may be standard JBS implants within the drift layer. The termination regions control unwanted conductivity at the edge of the heterojunction.

The drift layer (34) disclosed herein also has JBS structures within the interior body of the drift layer (34). The use of JBS technology within the body of the new diode is a considerably advantageous development in diode construction.

To distinguish the new position of JBS structures from those used at termination locations of the prior art, this detailed description and the claims that follow describe the new JBS implants as being located within the "conductive channel" of the diode. Although conductive channels are often described for transistors instead of diodes, for purposes herein, the term "conductive channel" is interpreted in its broadest sense and in no way limits this invention. In one sense, the conductive channel of the diode includes any region within the diode body by which carriers travel from anode to cathode. Generally, the conductive channel is considered to be within the bulk of the diode body as opposed to being located along the edges.

The diode (30) has an improved reverse blocking voltage ability due to be p+ well implants (40) within the conductive channel of the diode. The implants (40) can be established within the drift layer using known JBS techniques. By combining the JBS implants with a silicon mesa anode (36), this diode achieves a high reverse blocking voltage maximum in the reverse biased state along with excellent forward conduction in the on-state. The JBS implants assist in a reverse biased operation by increasing the depletion regions supporting an applied voltage. The heavily doped silicon layer (36) provides carriers for increasing forward conduction under positive bias.

The diode includes an anode (45) and cathode (48) for completing the conduction path. A passivation layer (50) covers the sidewalls of the silicon mesa (36) and the uncovered portion of the drift layer (34). As known in the art of semiconductor devices, the passivation layer (50) protects the device from outside elements as well as preventing undesirable hot carrier conduction along the junction regions of the device.

The Schottky diode (30) according to this invention has a layered construction that is typical in diode technology. This detailed description discusses the diode construction as having one layer "on" other layers. The term "on" should be construed broadly to encompass designs that include layers between other layers. This invention is not limited to a construction in which a layer "on" another layer requires that the layers be directly adjacent. Furthermore, for clarity, this detailed description refers to specific doping types without limiting the possibility of reverse types in any given layer. This specification refers to a "top" surface and a "bottom" surface as "first" and "second" surfaces respectively.

The embodiment of this invention shown as the diode (30) of FIG. 2 is a Schottky diode having reduced series resistance in the conductive channel from anode (45) to cathode (48). The diode (30) includes a first semiconductor layer of a first conductivity type forming a drift region (34) having a top surface (37) and a bottom surface (35). The JBS structure that increases the reverse voltage blocking ability includes at least one doped well (40) formed within the conductive channel of the diode and within the drift region (34). The implanted doped well (40) is located adjacent the top surface (37) of the drift region. To ensure sufficient carriers for high conductivity in the forward biased condition, the diode (30) incorporates a silicon mesa (36) formed on the top surface (37) of the drift region (34) adjacent the doped well (40).

Although the doping in the diode can be of any type appropriate for the circumstances, the Schottky diode of FIG. 2 has an $n^+$ type silicon carbide substrate (32), an $n^-$ type silicon carbide drift region (34), $p^+$ type silicon carbide implanted well regions (40), and a highly doped $p^+$ type silicon anode mesa (36). Alternatively the silicon mesa may be an $n^-$ type, depending on the application.

The Schottky diode of FIG. 2 includes termination layers which are also implanted p+ type well regions in the n− type drift layer. The termination wells (38, 39) arrest current flow at the edges of the heterojunction. The diode of this invention may also include the conductive substrate, typically of n+ doping, on the bottom surface (35) of the drift layer (34).

By incorporating both a JBS implant structure with a silicon mesa for the anode, this diode may have a significantly thinner substrate and maintain full functionality. The substrate (32) may be from about 10 microns to about 100 microns thick, a considerable reduction from prior diodes. In a preferred embodiment, the diode substrate (32) is less than 25 microns thick. In a most preferred embodiment, the substrate is less than 10 microns thick. An anode (45) on the silicon mesa (36) and cathode (48) on the bottom surface of the substrate (32) complete the conductive path through the diode (30).

The dimensions of the component layers within the diode (30), may be adjusted for optimal performance. In one embodiment the diode (30) has a substrate that is less than 10 microns and a drift layer that is about 25 microns thick. In a preferred embodiment, the substrate is doped to about $5\times10^{18}$ cm$^{-3}$; the drift region is doped to about $3\times10^{15}$; and the silicon mesa is doped to about $1\times10^{18}$ cm$^{-3}$.

Figure 3:
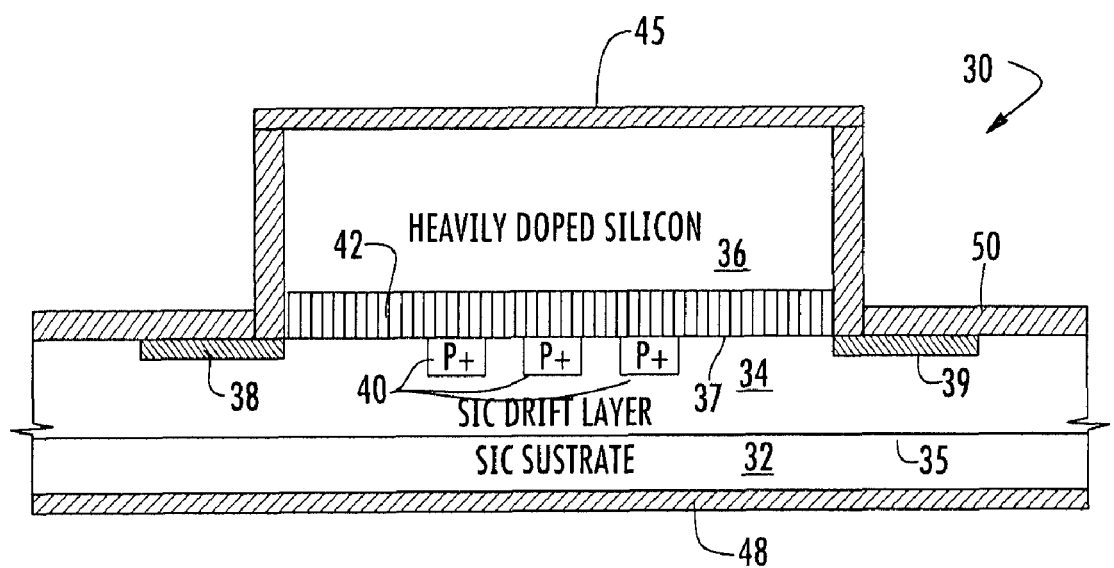
FIG. 3 is a diode according to this invention having JBS implants in the conductive channel of the diode and a Schottky barrier height layer in the mesa.
Figure 4:
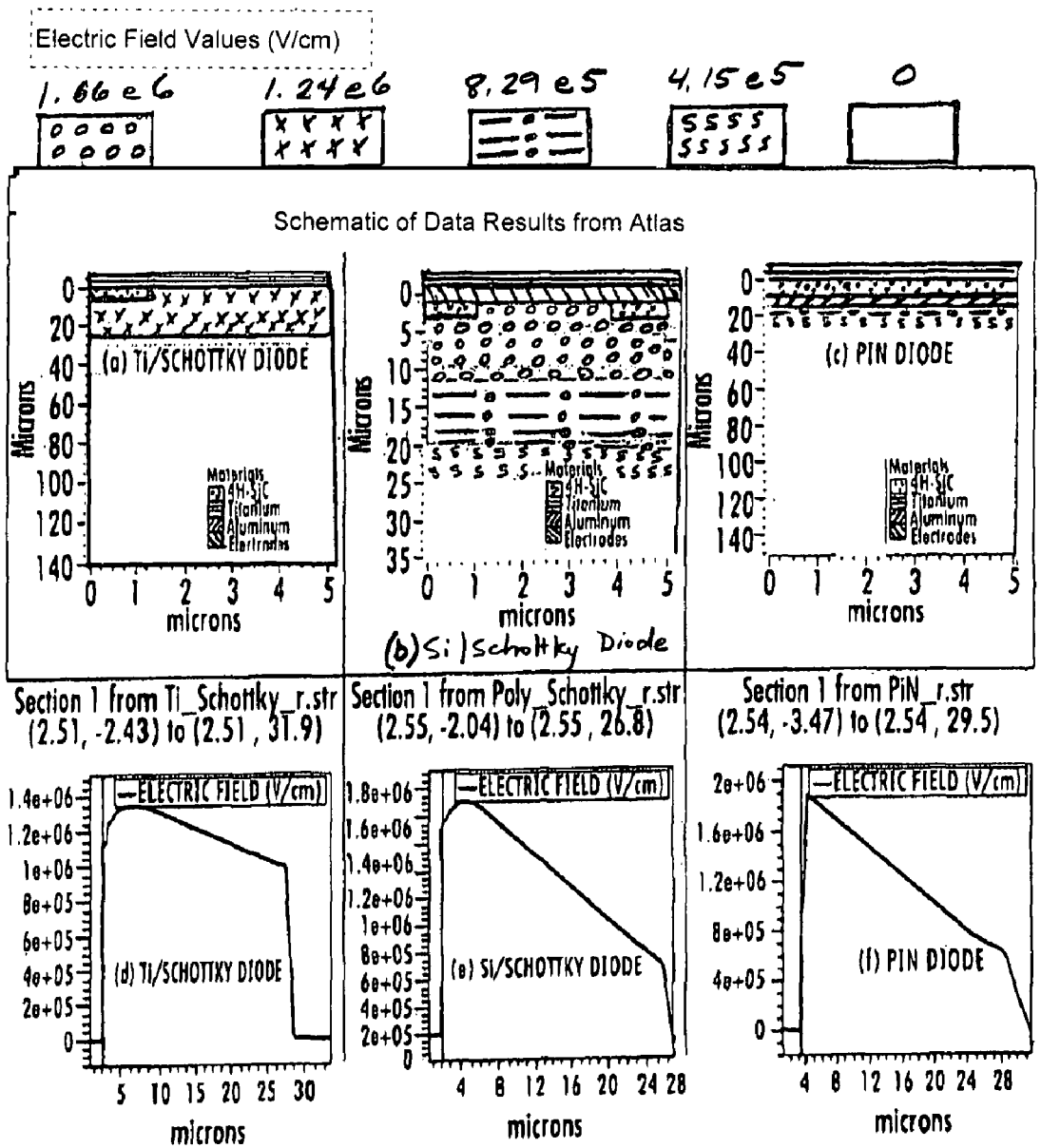
FIG. 4 is a comparative graphic showing the magnitude of the electric field across the body of three different diode constructions.

FIGS. 3 and 4 compare the performance of the new diode (30) having a silicon anode mesa (36) with other diodes having different material characteristics. In particular, FIGS. 3 and 4 illustrate the forward current capabilities in the on-state for diodes having one of three designs—a Schottky diode with a titanium anode, a Schottky diode with a poly-silicon anode mesa according to this invention, and a standard PIN diode.

One significant feature illustrated in FIG. 3 is that the drift region in a Schottky diode with a silicon anode mesa supports a maximum electric field of 1.7 MV/cm (at a reverse bias of 3000 volts) throughout a thickness of more than one micron into the drift region. By comparison, the Schottky diode with a titanium anode supported only a 1.4 MV/cm electric field at the same 3000 volts. The PIN diode supported a greater electric field of 1.8 MV/cm but its built-in potential (~2.5 V for SiC) results in the highest forward voltage drop in the ON state. The following Table 1 shows additional results of the tests illustrated in FIG. 3:

TABLE 1

|  | Ti/SiC Schottky Diode | P-Type Si/SiC Schottky Diode | PIN Diode |
|---|---|---|---|
| Schottky Material Work Function (eV) | 1.3 | 1.7 | >2.5 V $V_{bi}$ = built in potential |
| Drift Doping (cm$^{-3}$) and thickness (microns) | $1 \times 10^{15}$ 25 microns | $3 \times 10^{15}$ 25 microns | $3 \times 10^{15}$ 25 microns |
| Substrate thickness (microns) | 115 microns | 10 microns | 125 microns |
| Carrier Lifetime in Drift Region (ns) | N/A | N/A | 300 |
| Electrical Field at 3000 V (MV/cm) | 1.4 | 1.7 | 1.8 |

As recited in the claims below, the diode of this invention supports the electric field through a significant thickness of the drift region—at least one micron—and withstands a reverse voltage that is comparable to that of the other diodes, which also require much thicker substrates. In fact, as shown in Table 1, the diode disclosed herein has a substrate of only 10 microns, compared to 115 microns for the substrate of the titanium anode diode and 125 microns for the substrate of the standard PIN diode.

FIG. 4 shows the forward current characteristics of the diodes compared in Table 3. The new diode (30) provides forward current that is controllable at higher voltages, while the other diodes show either a lower forward current (titanium anode) or an immediate surge (standard PIN). The forward current capabilities of the silicon mesa diode (30) are significant in that the diode provides a current density of more than 40 A/cm$^2$ at an anode voltage of 2V, as set forth in FIG. 4.

Figure 5:
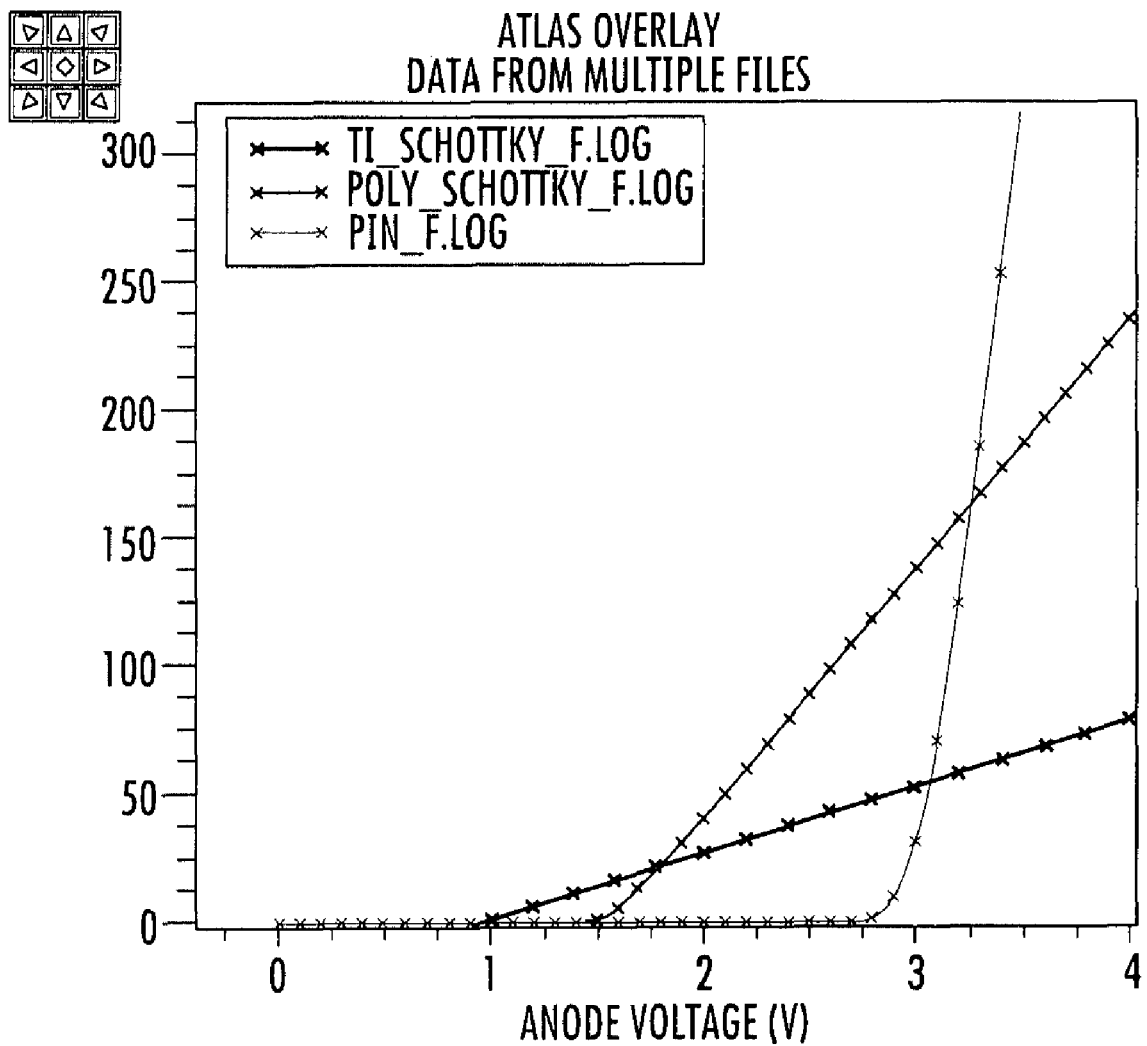
FIG. 5 is a graph of forward current density as a function of anode voltage for three different diode constructions, including the diodes according to this invention.
Figure 6:
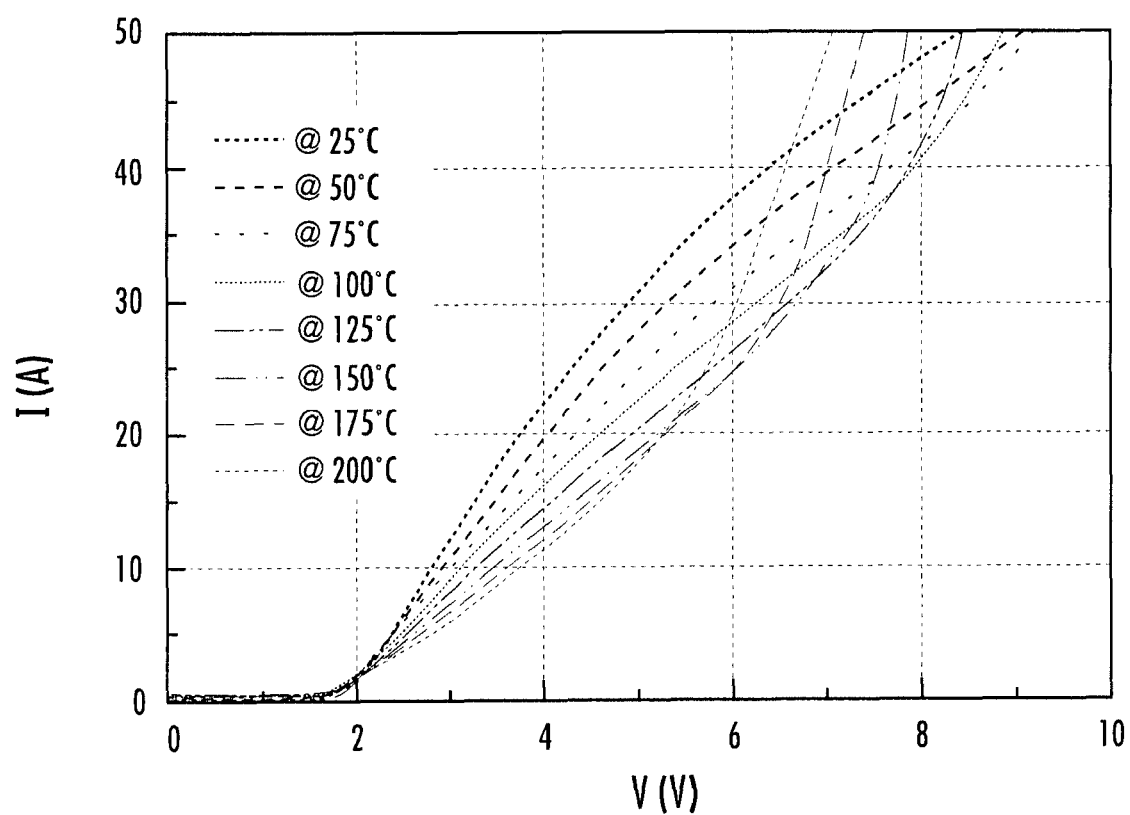
FIG. 6 is a current versus voltage plot for the diode of this invention at different temperatures.
Figure 7:
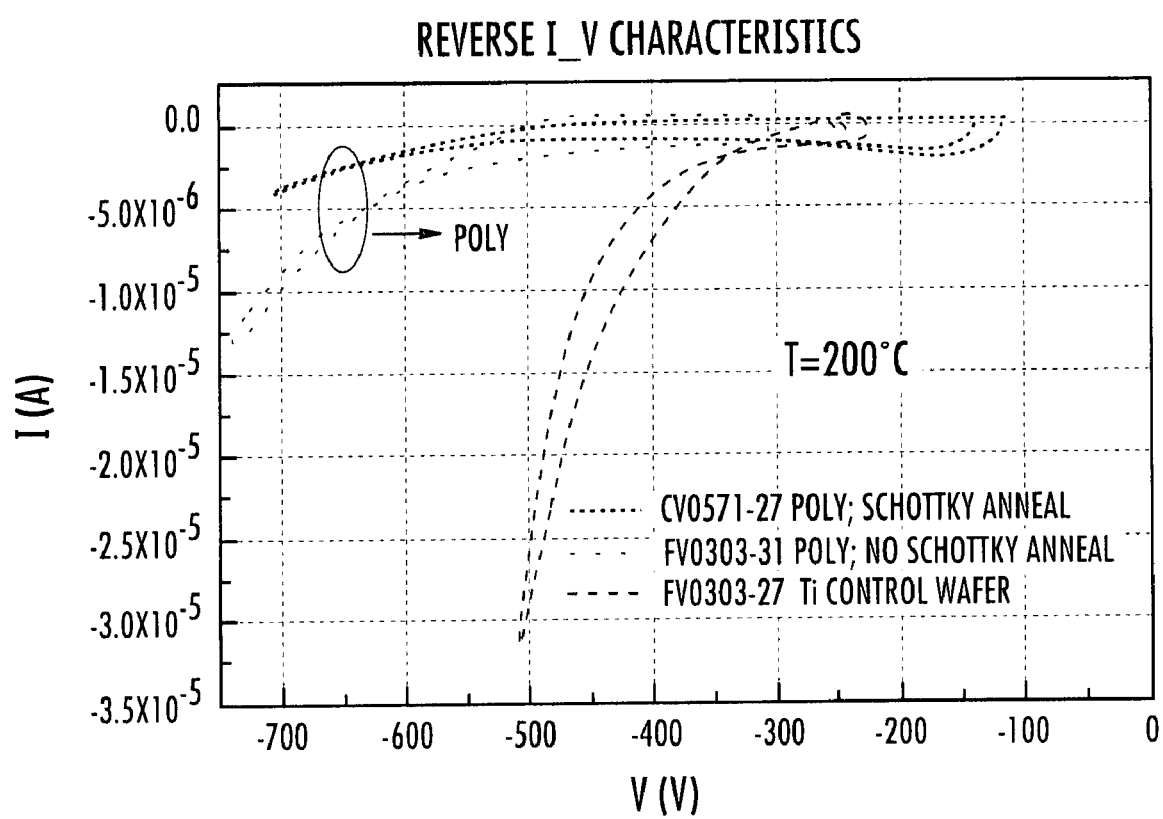
FIG. 7 is a current versus voltage plot comparing three different diodes under reverse bias, including diodes according to the invention.

FIGS. 5 and 6 illustrate the current characteristics of the diode (30) with a poly-silicon anode mesa (36). In particular, FIG. 5 shows current surging capability of the new diode (30). FIG. 6 shows the voltage blocking capabilities of three diodes for comparison. Significantly, the titanium anode control wafer exhibited larger reverse leakage current at lower voltage values than either diode with a poly-silicon anode mesa.

FIGS. 3-6 include references to a Schottky diode (30) having a poly-silicon anode mesa. The anode mesa may also be formed of poly-silicon doped silicon. Furthermore, the poly-silicon diode (30) may include any or all of the features discussed above in regard to FIG. 2. These features will not be repeated, but are referenced as if set forth fully again.

The silicon anode diode described above may be formed by growing a silicon carbide drift region (34) having n– doping type on a silicon carbide substrate (32). Next, at least one junction barrier Schottky well (40) is formed within the conductive channel of the drift region (34). Additional wells may be formed as required. The JBS implanted wells (40) may be formed via either standard doping techniques that are common in semiconductor technology or epitaxial growth. The method of this invention further includes forming a silicon mesa (36) on the drift region (34) adjacent the junction barrier Schottky wells (40).

Prior to forming the silicon anode mesa (36), at least one doped termination well (38, 39) may be implanted within the drift region (34) between the junction barrier Schottky wells (40) and the edge of the drift region (34). The method of forming a Schottky diode according to this invention further includes the step of annealing the implanted wells (40) to activate the dopants.

In a preferred embodiment, a passivation layer (50) made of silicon nitride, silicon dioxide, or other protective, nonconductive materials is deposited on the surface (37) of the drift region (34) after implanting the JBS wells (40) and the termination wells (48, 49). This embodiment of the new method includes opening a window in the passivation layer (50) so that at least one edge of the window aligns with the doped termination well (40). The silicon mesa (36) is then deposited within the window and doped according to the required specifications. In the exemplary embodiment of FIG. 2, the silicon mesa (36) supports the anode contact (45) and would be doped to p+ conductivity.

Instead of forming a silicon anode mesa (36) through the passivation window, the diode (30) may be produced by thermally or mechanically bonding a silicon wafer onto the drift region (34). The silicon wafer may be doped to either an n– conductivity type or a p+ conductivity type within a region of the silicon wafer corresponding to the conductive channel of the diode (30). Next, the method includes the step of etching the silicon wafer to form the mesa (36) so that the edges of the mesa are adjacent the termination wells (38, 39) in the drift region (34).

Whether the mesa (36) is formed by depositing the silicon in a window opened within the passivation layer (50) or by bonding the silicon and silicon carbide layers with a thermal or mechanical bond, the substrate (32) of the finished diode (30) can be significantly thinner than that of standard devices. To achieve the thinner substrate, the method herein includes the step of grinding the substrate (30) to a thickness less than 100 microns. In a preferred embodiment, the substrate (30) is ground to a thickness that is between about 10 microns and about 25 microns.

The Schottky barrier layer (36a in FIG. 2) can also be formed separately from the silicon mesa. The Schottky barrier height can be adjusted by choosing dopants and doping concentrations accordingly.

To complete the diode, ohmic contacts (45, 48) are deposited on the silicon anode mesa and to the surface of the substrate opposite the drift region. The relevant ohmic metals used in this step are well understood in the art. In accordance with standard manufacturing techniques, the diode is diced for packaging.

Those having skill in the art will recognize that the invention may be embodied in many different types of bipolar device structures. Accordingly, the invention is not limited to the particular structures illustrated herein.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A Schottky diode comprising:
   a first semiconductor layer of a first conductivity type forming a drift region, said drift region having a first surface and a second surface;
   at least one doped well within a conductive channel in said drift region and adjacent said first surface, said doped well having an opposite conductivity type as said drift region; and
   a silicon mesa on said first surface of said drift region adjacent said doped well.

2. A Schottky diode according to claim 1, wherein said silicon mesa comprises a silicon Schottky barrier layer on said drift region and a second layer of silicon on said barrier layer.

3. A Schottky diode according to claim 1, wherein said drift region is N− type silicon carbide, said well is p+ type silicon carbide, and said mesa is n type silicon.

4. A Schottky diode according to claim 1, wherein said drift region is N− type silicon carbide, said well is p+ type silicon carbide, and said mesa is p+ type silicon.

5. A Schottky diode according to claim 1, wherein said drift region further comprises termination wells at said first surface and adjacent edges of said mesa, said termination wells arresting current flow at said edges.

6. A Schottky diode according to claim 1, further comprising a conductive substrate on said second surface of said drift region.

7. A Schottky diode according to claim 6, wherein said substrate is less than about 100 microns thick.

8. A Schottky diode according to claim 7, wherein said substrate is less than about 25 microns thick.

9. A Schottky diode according to claim 6, further comprising a cathode contact on a surface of said substrate opposite said drift region.

10. A Schottky diode according to claim 1, further comprising an anode contact on said mesa.

11. A Schottky diode according to claim 1, further comprising a passivation layer covering sides of said mesa and the first surface of said drift region adjacent said mesa.

12. A Schottky diode according to claim 1, wherein said drift region is about 25 microns thick.

13. A Schottky diode according to claim 1, wherein said drift region is doped to about $3 \times 10^{15}$ cm$^{-3}$.

14. A Schottky diode comprising:
   a drift region of a first conductivity type, said drift region having a first surface and a second surface;
   at least one doped well within a conductive channel in said drift region and adjacent said first surface; said doped well having an opposite conductivity type as said drift region;
   a silicon mesa on said first surface of said drift region adjacent said doped well, wherein said drift region supports a maximum electric field without breakdown throughout a thickness of more than one micron in said drift region.

15. A Schottky diode according to claim 14, wherein said maximum electric field is greater than $1.4 \times 10^6$ V/cm.

16. A Schottky diode according to claim 14, wherein said diode has a current density that is greater than 50 amps/cm$^2$ at an anode voltage of 2 volts.

17. A Schottky diode according to claim 14, wherein the maximum reverse blocking voltage is greater than 2800 V.

18. Schottky diode according to claim 14, wherein said drift region is n− type silicon carbide, said well is p+ type silicon carbide, and said mesa is n type_silicon.

19. A Schottky diode according to claim 14, wherein said drift region is n− type silicon carbide, said well is p+ type silicon carbide, and said mesa is p+ type silicon.

20. A Schottky diode according to claim 14, wherein said drift region further comprises termination wells at said first surface and adjacent edges of said mesa, said termination wells arresting current flow at said edges.

21. A Schottky diode according to claim 14, further comprising a conductive substrate on said second surface of said drift region.

22. A Schottky diode according to claim 21, wherein said substrate is less than about 100 microns thick.

23. A Schottky diode according to claim 22, further comprising a cathode contact on a surface of said substrate opposite said drift region.

24. A Schottky diode according to claim 14, further comprising an anode contact on said mesa.

25. A Schottky diode according to claim 14, further comprising a passivation layer covering sides of said mesa and the first surface of said drift region adjacent said mesa.

26. A Schottky diode according to claim 14, wherein said drift region is about 25 microns thick.

27. A Schottky diode according to claim 14, wherein said drift region is doped to about $3 \times 10^{15}$ cm$^{-3}$.

28. A Schottky diode according to claim 14, wherein said silicon mesa comprises a silicon Schottky barrier layer on said drift region and a second layer of silicon on said barrier layer.

29. A Schottky diode comprising:
   a first silicon carbide layer of a first conductivity type forming a drift region, said drift region having a first surface and a second surface;
   at least one doped well substantially within a conductive channel in said drift region and adjacent said first surface, said doped well having an opposite conductivity type as said drift region; and
   a silicon mesa on said first surface of said drift region adjacent said doped well.

30. A Schottky diode according to claim 29, wherein said silicon mesa comprises a silicon Schottky barrier layer on said drift region and a second layer of silicon on said barrier layer.

31. A Schottky diode according to claim 29, wherein said silicon mesa has the same conductivity type as said drift region.

32. A Schottky diode according to claim 29, wherein said silicon mesa has the opposite conductivity type of said drift region.

33. A Schottky diode according to claim 29, wherein said drift region further comprises termination wells at said first surface and adjacent edges of said mesa, said termination wells arresting current flow at said edges.

34. A Schottky diode according to claim 29, further comprising a conductive substrate on said second surface of said drift region.

35. A Schottky diode according to claim 34, wherein said substrate is less than about 100 microns thick.

36. A Schottky diode according to claim 35, wherein said substrate is less than about 25 microns thick.

37. A Schottky diode according to claim 35, further comprising a cathode contact on a surface of said substrate opposite said drift region.

38. A Schottky diode according to claim 29, further comprising an anode contact on said mesa.

39. A Schottky diode according to claim 29, further comprising a passivation layer covering sides of said mesa and the first surface of said drift region adjacent said mesa.

40. A Schottky diode according to claim 29, wherein said drift region is about 25 microns thick.

41. A Schottky diode according to claim 29, wherein said drift region is doped to about $3\times10^{15}$ cm$^{-3}$.

* * * * *

UNITED STATES PATENT AND TRADEMARK OFFICE
CERTIFICATE OF CORRECTION

PATENT NO. : 8,384,181 B2
APPLICATION NO. : 11/673117
DATED : February 26, 2013
INVENTOR(S) : Zhang et al.

It is certified that error appears in the above-identified patent and that said Letters Patent is hereby corrected as shown below:

In the Claims:

In claim 3, in column 7, at line 26, change "N-" to -- n- --.

In claim 4, in column 7, at line 29, change "N-" to -- n- --.

In claim 18, in column 8, at line 6, change "Schottky diode" to -- A Schottky diode --.

In claim 18, in column 8, at line 8, change "type_silicon" to -- type silicon --.

In claim 37, in column 9, at line 1, change "according to claim 35" to -- according to claim 34 --.

Signed and Sealed this
Sixth Day of August, 2013

Teresa Stanek Rea
*Acting Director of the United States Patent and Trademark Office*